US005771569A

United States Patent [19]

Inaba

[11] Patent Number: 5,771,569
[45] Date of Patent: Jun. 30, 1998

[54] MANUFACTURING METHOD FOR MAGNETIC HEAD SUSPENSION

[75] Inventor: Masaichi Inaba, Ushiku, Japan

[73] Assignee: Nippon Mektron, Ltd., Tokyo, Japan

[21] Appl. No.: 777,355

[22] Filed: Dec. 27, 1996

[30] Foreign Application Priority Data

Apr. 27, 1996 [JP] Japan .................................. 8-130872

[51] Int. Cl.$^6$ ....................................................... G11B 5/42
[52] U.S. Cl. .................................. 29/603.04; 29/603.01; 216/52; 216/75; 216/94; 360/103; 360/104
[58] Field of Search .......................... 29/603.01, 603.04, 29/603.05, 603.06; 360/103, 104; 216/75, 94, 100, 52

[56] References Cited

U.S. PATENT DOCUMENTS

| | | |
|---|---|---|
| 3,508,815 | 4/1970 | Johnson . |
| 4,208,257 | 6/1980 | Hom-ma et al. . |
| 4,432,027 | 2/1984 | Higuchi . |
| 4,645,280 | 2/1987 | Gordon et al. . |
| 4,823,217 | 4/1989 | Kato et al. . |
| 5,121,273 | 6/1992 | Slezak . |
| 5,185,683 | 2/1993 | Oberg et al. . |
| 5,339,217 | 8/1994 | Cohen et al. . |
| 5,454,158 | 10/1995 | Fontana, Jr. et al. . |
| 5,528,819 | 6/1996 | McKay et al. . |
| 5,535,074 | 7/1996 | Leung . |
| 5,536,584 | 7/1996 | Sotokawa et al. . |
| 5,597,496 | 1/1997 | Masaichi et al. . |

FOREIGN PATENT DOCUMENTS

| | | |
|---|---|---|
| 53-74414 | 7/1978 | Japan . |
| 63-113917 | 5/1988 | Japan . |
| 258547 | 11/1993 | Japan . |

*Primary Examiner*—Carl E. Hall
*Attorney, Agent, or Firm*—Alix, Yale & Ristas, LLP

[57] ABSTRACT

A magnetic head suspension, wherein the interconnection wiring is integrated with a spring-like metal suspension member, is manufactured by first preparing a laminated plate comprised of a flexible insulating base sandwiched between a resilient metal layer and a layer of an electrical conductor. The electrical conductor layer and resilient metal layer are respectively formed into the desired circuit wiring pattern and a suspension member, unnecessary portions of the insulating base are removed, the wiring pattern is provided with a protective layer and the suspension member is mechanically formed into a desired final configuration.

6 Claims, 1 Drawing Sheet

MANUFACTURING METHOD FOR MAGNETIC HEAD SUSPENSION

BACKGROUND OF THE INVENTION

(1) Field of the Invention

The present invention relates to a suspension for a magnetic head employed with a disk drive or the like and, particularly, to a method for the manufacture of such a suspension. More specifically, this invention is directed to a magnetic head suspension wherein the circuitry for connecting the head to a read/write amplifier substrate is integrated with a head suspension member and, especially, to a method for the fabrication of such a head suspension. Accordingly, the general objects of the present invention are to provide novel and improved methods and articles of such character.

(2) Description of the Prior Art

While not limited thereto in its utility, the present invention is particularly well-suited for employment in a magnetic disk unit which includes at least one rotary disk on which information is magnetically recorded, a head assembly including a magnetic head for reading or writing data from or onto the disk, and a head positioning actuator for moving the head to a desired track position and retaining the head above the track. In such a disk unit, the head assembly will include a suspension upon which the magnetic head is supported.

An example of a prior art magnetic head suspension is disclosed in published Japanese Patent Application No. 63-113917. In this prior art suspension, the magnetic head is attached to a flexure by means of an epoxy resin or the like and the flexure is provided on a load beam by laser welding or other similar means. A gold-plated copper wire or the like, provided with an insulating coating of urethane or the like, is connected to an electrode on the magnetic head by ultrasonic bonding, soldering, etc. This connecting wire constitutes a lead by which signals are transmitted between the head and an external circuit. The connection wire is turned a predetermined number of times and enclosed in a protective flexible insulating resin tube which is mounted on the suspension assembly by crimping a part thereof or by other suitable means.

The above-described prior art magnetic head suspension assembly possesses a number of disadvantages. Firstly, connecting the lead wire to the electrode on the magnetic head device is a highly labor intensive task. The inherent inefficiency of this task makes it difficult to improve productivity. A recent trend in reducing the size of magnetic head devices and the increased number of terminals due to the expanding usage of MR devices is worsening the above-described problem. Secondly, the rigidity of the lead wire and its protective tube adversely affects the ability to hold the magnetic head device in position above a selected track on the disk. Further, the air currents generated by rotation of the recording medium imposes forces on the lead wire/tube and these forces also adversely affect the ability to maintain the magnetic head device in a desired position and attitude relative to the recording medium.

An attempt to solve the above-discussed problems is represented by the disclosure of published Japanese Patent Application No. 53-74414. This proposed solution employs a flexible circuit board as the supporting mechanism for a magnetic head, the flexible circuit board thus combining the interconnection lead wires and a mechanical suspension member. This approach, however, presents significant problems with respect to achieving accurate positioning of the magnetic head, which is the most basic requirement for a head suspension, applying an appropriate load, and securing an appropriate retaining position. In practice, it is difficult to adopt the technique of Japanese Application No. 53-74414 to recently introduced high-density magnetic disk units.

As a general solution to the problems inherent in using conventional, i.e., discrete, lead wires, it has been proposed to utilize a flexible circuit board for defining the interconnecting wiring and to bond the flexible circuit board to a spring-like suspension member by means of an adhesive or the like. However, the gluing together of a discrete flexible circuit board and a suspension spring presents a problem in that it inevitably sacrifices weight to achieve production efficiency. This is contrary to the increasing demand for lighter weight head positioning servo systems which is inherent in the desire to obtain increases in read/write speed.

Yet another proposed solution to the above-discussed problems, evidenced by applicant's published Japanese Application No. 8-36712, comprises a magnetic head suspension wherein a predetermined circuit wiring pattern is integrally formed on a suspension via a flexible insulating base member.

SUMMARY OF THE INVENTION

An object of the present invention is to provide a magnetic head suspension wherein the interconnection wiring is integrated with a suspension member to provide a unitary magnetic head suspension which may be efficiently fabricated. Another object of the invention is to provide a method for manufacturing such a unitary magnetic head suspension.

A manufacturing method in accordance with the invention includes the steps of preparing a laminated plate comprised of a flexible insulating base layer sandwiched between a layer of resilient metal and a layer of electrically conductive material, forming the layer of electrically conductive material into a predetermined circuit wiring pattern, forming the resilient metal layer into a desired shape from which the suspension member may be formed, removing the flexible insulating base member where it is not required to provide electrical isolation between the wiring pattern and suspension member by means of plasma etching from the circuit wiring pattern side of the laminated plate, forming a protective layer over the surface of the wiring pattern, and forming the remaining portion of the resilient metal layer into the appropriate configuration for resiliently supporting a magnetic head by bending.

In the practice of the present invention, the forming of the circuit wiring pattern and the forming of the suspension member intermediate can be simultaneously accomplished through the use of a photofabricating technique and apparatus which includes a double-side simultaneous exposure system.

Also in accordance with a preferred embodiment of the invention, after the circuit wiring pattern is formed, a metal having high electrical conductivity may be deposited over at least part of the circuit wiring pattern in order to enhance the ability to electrically connect a circuit element, for example a magnetic head, to the wiring pattern. It is further possible to form the surface protection layer in such a manner that predetermined areas of the circuit wiring pattern, particularly the areas on which the high conductivity material has been deposited, remain exposed.

BRIEF DESCRIPTION OF THE DRAWING

The present invention may be better understood, and its numerous objects and advantages will become apparent to those skilled in the art, by reference to the accompanying drawing which schematically illustrates steps performed in the manufacture of a magnetic head suspension in accordance with the present invention.

DESCRIPTION OF THE DISCLOSED EMBODIMENT

Figure 1A:
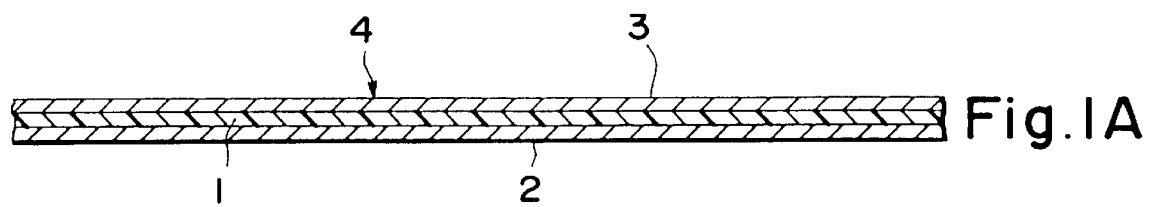

FIGS. 1A through 1D depict a manufacturing method for a magnetic head suspension in accordance with the present invention. As shown in FIG. 1A, a resilient metal layer 2, comprised of stainless steel or the like and having a thickness typically in the range of 15 µm to about 70 µm, is provided on a first surface of a flexible insulating base member 1. Base member 1, in accordance with a preferred embodiment, is comprised of a polyimide film or the like having a thickness in the range of about 3 µm to about 25 µm. A layer of electrically conductive material, for example a copper foil or the like having a thickness in the range of about 3 µm to about 20 µm, is provided on the surface of base member 1 disposed opposite to resilient metal layer 2. Accordingly, the layers 1, 2 and 3 form a laminated plate which is indicated generally at 4.

Figure 1B:
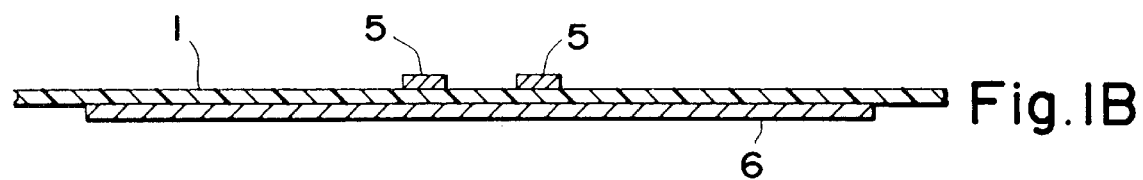

Referring to FIG. 1B, after formation of plate 4, the electrically conductive layer 3 and the metal layer 2 are subjected to a photofabrication technique carried out by a double-side simultaneous exposure type apparatus which is capable of accurately positioning the exposure masks on both sides of plate 4 in relation to one another. The photofabrication technique produces, in the known manner by selective removal, a predetermined circuit wiring pattern 5 from the electrically conductive layer 3 and a suspension member 6 of a predetermined shape from resilient metal layer 2. As will be explained in greater detail below, the predetermined shape of the suspension member 6 produced by the photofabrication process is not the final shape of the suspension member but, rather, comprises a planar intermediate shape.

Figure 1C:
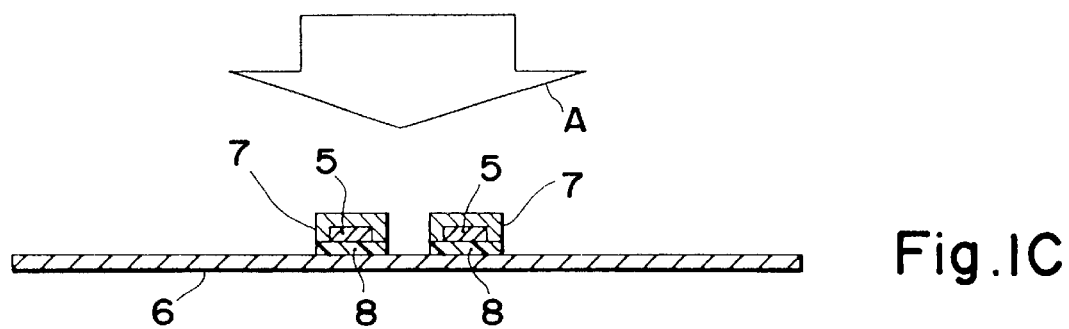

In the next step, as illustrated in FIG. 1C, a metallic layer 7, comprised of a metal such as gold having high electrical conductivity, is deposited, for example by plating, in a predetermined area(s) on the circuit wiring pattern 5. The purpose of conductive layer 7 is to enhance the ability to bond circuit elements to wiring pattern 5 and thereby establish electrical connection between such circuit elements and the wiring pattern.

After formation of the layer 7, and as indicated schematically by arrow A, plasma etching will be carried out from the circuit wiring pattern side of laminated plate 4 to remove unnecessary area(s) of the flexible insulating base member 1. In the disclosed embodiment, this results in an insulating layer 8 being disposed only between the conductors of the circuit wiring pattern 5 and the suspension member intermediate 6.

Figure 1D:
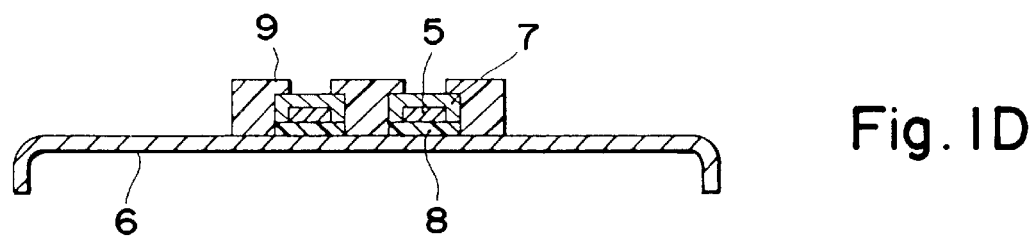

As illustrated in FIG. 1D, after the plasma etching step, a surface protection layer 9 is formed over the surface of circuit wiring pattern 5 by a photofabrication technique which employs a photosensitive polyimide resin or the like. In this processing step, the surface protection layer 9 can be formed so that the region(s) where the metal layer 7 has been plated are left exposed. In the final step, the suspension member 6 is bent into the requisite final configuration.

As should be obvious from the above description, the process depicted in the drawing makes it possible to fabricate an integrated magnetic head suspension and interconnection circuit wiring pattern in a highly efficient manner.

A manufacturing method for a magnetic head suspension in accordance with the present invention enables a predetermined circuit wiring pattern and a suspension member to be formed into one piece by employing a double-surface simultaneous exposure system which is capable of highly accurate positioning. This makes it possible to provide an inexpensive magnetic head suspension which is integral with the interconnecting circuitry, the reduction in expense resulting from a reduced number of process steps and a reduction in required labor whereby there is a reduction in total manufacturing costs.

While a preferred embodiment has been shown and described, various modifications and substitutions may be made thereto without departing from the spirit and scope of the invention. Accordingly, it is to be understood that the present invention has been described by way of illustration and not limitation.

What is claimed is:

1. A method for the manufacture of a magnetic head suspension comprising the steps of:

preparing a laminated plate comprising a flexible insulating base disposed between a resilient metal layer and a layer of electrically conductive material;

forming said layer of electrically conductive material into a circuit wiring pattern and also forming said resilient metal layer into a planar suspension member having a desired shape;

removing substantially all of said flexible insulating base which does not underlay the circuit wiring pattern by plasma etching from said circuit wiring pattern side of said laminated plate;

forming a surface protection layer on the surface of at least some of said circuit wiring pattern; and bending said planar suspension member to thereby impart a predetermined non-planar configuration thereto.

2. The manufacturing method of claim 1 wherein the step of forming said circuit wiring pattern and said planar suspension member comprises photofabrication including subjecting said laminated plate to double-side simultaneous exposure.

3. The method of claim 1 further comprising the step of:

producing a deposit of a metal having high electrical conductivity on a predetermined area of said circuit wiring pattern prior to said step of removing.

4. The method of claim 2 further comprising the step of:

producing a deposit of a metal having high electrical conductivity on a predetermined area of said circuit wiring pattern prior to forming said surface protection layer.

5. The method of claim 3 wherein said step of forming said surface protection layer comprises leaving at least a first predetermined area of said deposited high conductivity metal exposed.

6. The method of claim 4 wherein said step of forming said surface protection layer comprises leaving at least a first predetermined area of said deposited high conductivity metal exposed.

* * * * *